United States Patent
Ko et al.

(10) Patent No.: US 12,406,804 B2
(45) Date of Patent: Sep. 2, 2025

(54) CAPACITOR AND ELECTRONIC DEVICE COMPRISING SAME

(71) Applicant: SAMSUNG ELECTRONICS CO., LTD., Suwon-si (KR)

(72) Inventors: Jaehyun Ko, Suwon-si (KR); Sungyong Joo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 302 days.

(21) Appl. No.: 18/111,386

(22) Filed: Feb. 17, 2023

(65) Prior Publication Data

US 2023/0197337 A1 Jun. 22, 2023

Related U.S. Application Data

(63) Continuation of application No. PCT/KR2021/007974, filed on Jun. 24, 2021.

(30) Foreign Application Priority Data

Aug. 20, 2020 (KR) .................. 10-2020-0104309

(51) Int. Cl.
*H01G 2/06* (2006.01)
*H01G 4/224* (2006.01)
(Continued)

(52) U.S. Cl.
CPC .............. *H01G 2/06* (2013.01); *H01G 4/224* (2013.01); *H01G 4/236* (2013.01); *H05K 1/184* (2013.01); *H05K 2201/10015* (2013.01)

(58) Field of Classification Search
CPC ........ H05K 1/184; H01G 4/236; H01G 4/224; H01G 2/06
See application file for complete search history.

(56) References Cited

U.S. PATENT DOCUMENTS

| | | |
|---|---|---|
| 7,877,867 B2 | 2/2011 | Kawamura |
| 9,190,201 B2 | 11/2015 | Li et al. |

(Continued)

FOREIGN PATENT DOCUMENTS

| | | | |
|---|---|---|---|
| CN | 201754662 U | * | 3/2011 |
| CN | 206322592 U | | 7/2017 |

(Continued)

OTHER PUBLICATIONS

International Search Report (PCT/ISA/210) issued by the International Searching Authority on Oct. 18, 2021 in corresponding International Application No. PCT/KR2021/007974.

(Continued)

*Primary Examiner* — David M Sinclair
(74) *Attorney, Agent, or Firm* — Sughrue Mion, PLLC

(57) ABSTRACT

An electronic device including a substrate comprising a hole, and a capacitor capable of being inserted and fixed to the hole of the substrate. The electronic device includes a substrate including a hole, and a capacitor inserted to the hole so as to be mounted on the substrate. The capacitor includes a case provided to accommodate a dielectric therein and forming an exterior of the capacitor, a lead wire connected to the dielectric and extending from an inside of the case to an outside of a first side surface of the case, and a groove recessed on a second side surface of the case opposite to the first side surface and provided to be engaged with a side, which forms a circumference of the hole, of the substrate to allow the case to be inserted and fixed to the hole.

20 Claims, 23 Drawing Sheets

(51) Int. Cl.
*H01G 4/236* (2006.01)
*H05K 1/18* (2006.01)

(56) References Cited

U.S. PATENT DOCUMENTS

| | | |
|---|---|---|
| 9,387,970 B2 | 7/2016 | Cheong et al. |
| 2013/0286612 A1 | 10/2013 | Iwasaki et al. |
| 2019/0006101 A1 | 1/2019 | Matsumae et al. |

FOREIGN PATENT DOCUMENTS

| | | |
|---|---|---|
| EP | 2911487 A1 | 8/2015 |
| JP | 5-93075 U | 12/1993 |
| JP | 7-3130 U | 1/1995 |
| JP | 7-263836 A | 10/1995 |
| JP | 4843555 B2 | 12/2011 |
| JP | 4962533 A | 6/2012 |
| JP | 2012-151223 A | 8/2012 |
| JP | 2012-216731 A | 11/2012 |
| JP | 2013-222766 A | 10/2013 |
| JP | 2014-116522 A | 6/2014 |
| JP | 2014-143379 A | 8/2014 |
| JP | 2017-118041 A | 6/2017 |
| JP | 2017-168655 A | 9/2017 |
| JP | 2018-74058 A | 5/2018 |
| KR | 10-0275297 B1 | 12/2000 |
| KR | 10-0829100 B1 | 5/2008 |
| KR | 10-1066643 B1 | 9/2011 |
| KR | 20-0460596 Y1 | 6/2012 |
| KR | 10-1304387 B1 | 9/2013 |
| KR | 10-2013-0112919 A | 10/2013 |
| KR | 10-2015-0110024 A | 10/2015 |
| KR | 10-2016-0062353 A | 6/2016 |
| KR | 10-2017-0067451 A | 6/2017 |

OTHER PUBLICATIONS

Written Opinion (PCT/ISA/237) issued by the International Searching Authority on Oct. 18, 2021 in corresponding International Application No. PCT/KR2021/007974.

Office Action issued Jul. 23, 2025 by the Korean Patent Office for KR Patent Application No. 10-2020-0104309.

* cited by examiner

CAPACITOR AND ELECTRONIC DEVICE COMPRISING SAME

CROSS-REFERENCE TO RELATED APPLICATIONS

This application is a continuation application of International Application No. PCT/KR2021/007974, filed Jun. 24, 2021, which is based on and claims priority to Korean Patent Application No. 10-2020-0104309, filed on Aug. 20, 2020, in the Korean Intellectual Property Office, the disclosures of which are incorporated by reference herein in their entireties.

TECHNICAL FIELD

The present disclosure relates to a capacitor including an improved structure and an electronic device including the same.

BACKGROUND

1. Field

Capacitors are widely used in various electronic devices and are also used as parts of television (TV).

2. Description of Related Art

Recently, research on ultra-slim TV has been continuously conducted. Accordingly, it is required to reduce a thickness of a substrate, on which the capacitor is mounted, so as to realize an ultra-slim TV.

SUMMARY

The present disclosure is directed to providing a capacitor capable of improving a structure of a case of the capacitor so as to reduce the sum of a thickness of a substrate and a thickness of the capacitor mounted on the substrate and so as to secure a margin in thickness of the capacitor, and an electronic device including the same.

Further, the present disclosure is directed to providing a substrate including a hole, a capacitor capable of being inserted and fixed to the hole of the substrate, and an electronic device including the same.

Further, the present disclosure is directed to providing a capacitor capable of being fixed to a substrate without an additional fixing process or subsidiary materials, and an electronic device including the same.

One aspect of the present disclosure provides an electronic device including a substrate including a hole, and a capacitor inserted to the hole so as to be mounted on the substrate. The capacitor includes a case provided to accommodate a dielectric therein and forming an exterior of the capacitor, a lead wire connected to the dielectric and extending from an inside of the case to an outside of a first side surface of the case, and a groove recessed on a second side surface of the case opposite to the first side surface and provided to be engaged with a side, which forms a circumference of the hole, of the substrate to allow the case to be inserted and fixed to the hole.

Based on the capacitor being mounted on the substrate, an upper surface of the capacitor may be located above an upper surface of the substrate, and a lower surface of the capacitor may be located below a lower surface of the substrate.

The second side surface of the case may be fixed to the substrate by inserting the substrate into the groove.

The case may include a protrusion protruding from the first side surface to the outside of the case.

The first side surface of the case may be supported on the substrate as the protrusion is in contact with the substrate.

The groove may include a first contact surface in contact with the upper surface of the substrate.

The protrusion may include a second contact surface in contact with the upper surface of the substrate.

The first contact surface and the second contact surface may be arranged on the same plane to allow the capacitor to be horizontally mounted on the substrate.

A distance from an upper surface of the case to an upper surface of the protrusion may be the same as a distance from a lower surface of the case to a lower surface of the protrusion.

The groove may include a first surface provided to be in contact with an upper surface of the substrate, and a second surface provided to be inclined with respect to the first surface to guide an insertion of the substrate into the groove.

The groove may include a first groove and a second groove provided to be vertically symmetrical with respect to a virtual horizontal line dividing the case.

The substrate may further include a wire hole into which the lead wire is inserted.

The lead wire may include a first wire extending from the first side surface of the case, a second wire provided to be inserted into the wire hole, and a protruding member provided to connect the first wire and the second wire and formed to be bent outward of the wire hole.

The protruding member may be formed by being bent in a semicircle.

The substrate may further include a substrate protrusion protruding from the side, which forms the circumference of the hole, of the substrate.

The groove may be provided to correspond to the substrate protrusion to allow the substrate protrusion to be inserted thereinto.

The substrate protrusion may include a first substrate protrusion and a second substrate protrusion provided to be spaced apart from each other on the side.

The first substrate protrusion and the second substrate protrusion may be provided in different sizes.

The groove may include a first groove and a second groove provided to allow the first substrate protrusion and the second substrate protrusion to be inserted thereto, respectively.

Another aspect of the present disclosure provides a capacitor mounted on a substrate including a hole, the capacitor including a case provided to accommodate a dielectric therein and forming an exterior of the capacitor, a lead wire connected to the dielectric and extending from an inside of the case to an outside of the case, and a groove provided on one side surface of the case to allow a side, which forms a circumference of the hole, of the substrate to be inserted thereinto, and including a surface provided to be inclined with respect to the substrate to guide an insertion of the one side of the substrate.

The case may include a protrusion protruding from other side surface of the case to an outside of the case.

The protrusion may fix the other side surface of the case to the substrate by being in contact with the substrate.

The groove may include a first groove and a second groove provided to be vertically symmetrical with respect to a virtual horizontal line diving the case.

The substrate may further include a wire hole into which the lead wire is inserted.

The lead wire may include a first wire extending from one side surface of the case, a second wire provided to be inserted into the wire hole, and a protruding member provided to connect the first wire and the second wire and formed to be bent outward of the wire hole.

Another aspect of the present disclosure provides a capacitor mounted on a substrate including a hole, the capacitor including a case provided to accommodate a dielectric therein and forming an exterior of the capacitor, the case provided to be inserted into the hole, and a lead wire connected to the dielectric and extending from an inside of the case to an outside of the case. The case includes a groove provided on one side surface of the case, and provided to allow a side, which forms the hole, of the substrate to be inserted thereinto so as to fix the one side surface of the case to the substrate, and a protrusion provided in other side surface of the case and provided to be in contact with the substrate so as to fix the other side surface of the case to the substrate.

Embodiments, may provide a capacitor capable of improving a structure of a case of the capacitor so as to reduce the sum of a thickness of a substrate and a thickness of the capacitor mounted the substrate and so as to secure a margin in thickness of the capacitor, and an electronic device including the same.

Further, embodiments provide a substrate including a hole, a capacitor provided to be inserted and fixed in the hole of the substrate, and an electronic device including the same.

Further, embodiments may provide a capacitor provided to be fixed to a substrate without a separate fixing process or subsidiary materials, and an electronic device including the same.

BRIEF DESCRIPTION OF DRAWINGS

The above and other aspects and features will be more apparent from the following description of example embodiments, taken in conjunction with the accompanying drawings, in which.

DETAILED DESCRIPTION

Figure 1:
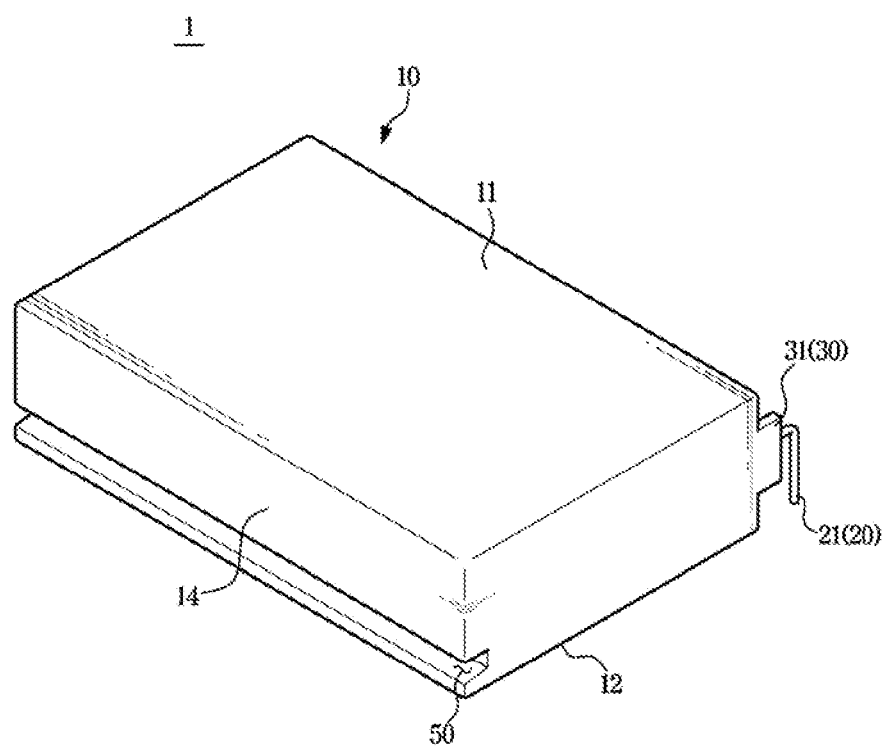
FIG. 1 is a perspective view of a capacitor according to one embodiment of the present disclosure.

Embodiments described in the disclosure and configurations shown in the drawings are merely examples of the embodiments of the disclosure, and may be modified in various different ways at the time of filing of the present application to replace the embodiments and drawings of the disclosure.

In addition, the same reference numerals or signs shown in the drawings of the disclosure indicate elements or components performing substantially the same function. Shapes and sizes of elements in the drawings may be exaggerated for clear description.

Also, the terms used herein are used to describe the embodiments and are not intended to limit and/or restrict the disclosure. The singular forms "a," "an" and "the" are intended to include the plural forms as well, unless the context clearly indicates otherwise. In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

It will be understood that, although the terms first, second, third, etc., may be used herein to describe various elements, but elements are not limited by these terms. These terms are only used to distinguish one element from another element. For example, without departing from the scope of the disclosure, a first element may be termed as a second element, and a second element may be termed as a first element. The term of "and/or" includes a plurality of combinations of relevant items or any one item among a plurality of relevant items.

In the following detailed description, the terms of "front", "rear", "left side", "right side" and the like may be defined by the drawings, but the shape and the location of the component is not limited by the term.

The disclosure will be described more fully hereinafter with reference to the accompanying drawings. A first contact surface may refer to a first surface of a groove, and a second contact surface may refer to a lower surface of a protrusion.

An electronic device may include substrates 40, 70, and 70a and capacitors 1, 2, 3, 4, 5 and 6 provided to be mounted on the substrate.

Figure 2:
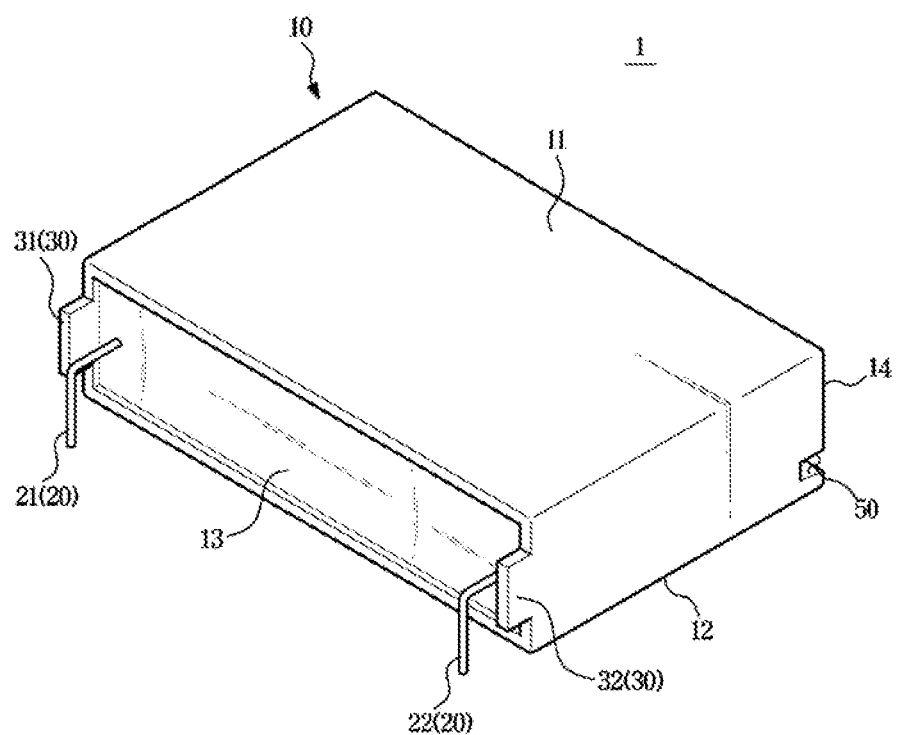
FIG. 2 is a view of the capacitor shown in FIG. 1 from another angle.

FIG. 1 is a perspective view of a capacitor according to one embodiment of the present disclosure. FIG. 2 is a view of the capacitor shown in FIG. 1 from another angle.

Referring to FIGS. 1 and 2, a capacitor 1 according to one embodiment of the present disclosure may include a case 10 with a substantially rectangular parallelepiped shape, a dielectric provided inside the case 10, and a lead wire 20 connected to the dielectric and extending from an inside of the case 10 to an outside.

According to one embodiment of the present disclosure, the capacitor 1 may include a film capacitor. The capacitor 1 may include a plastic film as a dielectric. A plurality of deposited metals may be formed to be spaced apart from each other on the plastic film, and the plastic film may be provided as a pair. A pair of plastic films may be disposed to be spaced apart from each other by a predetermined distance. The pair of plastic films may be wound while maintaining a distance from each other and accommodated in the case 10. The inside of the case 10 may be filled with a resin such as an epoxy resin or a urethane resin. Particularly, the capacitor 1 may be manufactured in such a way that after the wound plastic film is placed inside the case 10, the lead wire 20 is connected to each of the pair of plastic films and the inside of the case 10 is vacuum impregnated with a resin such as an epoxy resin or a urethane resin. Hereinafter a film capacitor will be described as an example of the capacitor, but the present disclosure is not limited thereto. The present disclosure may be applied to various types of capacitors.

Referring to FIGS. 1 and 2, the capacitor 1 according to one embodiment of the present disclosure may include the case 10.

The case 10 may be provided in a substantially rectangular parallelepiped shape. The case 10 may include an upper surface 11, a lower surface 12, and side surfaces 13 and 14. Four side surfaces may be provided at the case 10, but for convenience of description, reference numbers are given only to the two side surfaces 13 and 14 on which the lead wire 20 and a groove 50 are provided.

Hereinafter one side surface of the case 10 in which the lead wire 20 is arranged is referred to as a first side surface 13, and the other side surface of the case 10 in which the groove 50 is formed is referred to as a second side surface 14.

The lead wire 20 may be electrically connected to a dielectric (not shown) provided inside the case 10. The lead wire 20 may extend from the inside of the case 10 to the outside of the first side surface 13 of the case 10. The lead wire 20 may extend from the inside of the case 10 to the outside of the case 10 by passing through the first side surface 13.

The lead wire 20 may be provided as a pair. The lead wire 20 may include a first lead wire 21 and a second lead wire 22. The lead wire 20 may electrically connect the substrate 40 and the dielectric by being soldered to the substrate 40 (refer to FIG. 3) to be described later.

According to one embodiment of the present disclosure, the capacitor 1 may include a protrusion 30 formed at the case 10.

As shown FIGS. 1 and 2, the protrusion 30 may be provided as a pair. The protrusion 30 may include a first protrusion 31 and a second protrusion 32. However, the present disclosure is not limited thereto. Alternatively, one or three of more of the protrusions may be provided.

The protrusion 30 may be provided on the first side surface 13 of the case 10. The protrusion 30 may be formed on a side surface on which the lead wire 20 is provided. The protrusion 30 may be formed to protrude from the first side surface 13 toward the outside of the case 10. The protrusion 30 may be provided to support one side surface of the case 10 when the capacitor 1 is inserted into a hole 41 of the substrate 40. This will be described later.

The groove 50 may be provided on the second side surface 14 corresponding to the other side surface of the case 10. In other words, the case 10 may include the groove 50 provided on the second side surface 14. According to one embodiment of the present disclosure, the groove 50 may be provided to cross the second side surface 14 of the case 10 in a cross direction in the drawing. In other words, the groove 50 may be provided to cross the second side surface 14 of the case 10 in a horizontal direction. The groove 50 may be provided to support the other side surface of the case 10 when the capacitor 1 is inserted into the hole 41 of the substrate 40. This will be described later.

Figure 3:
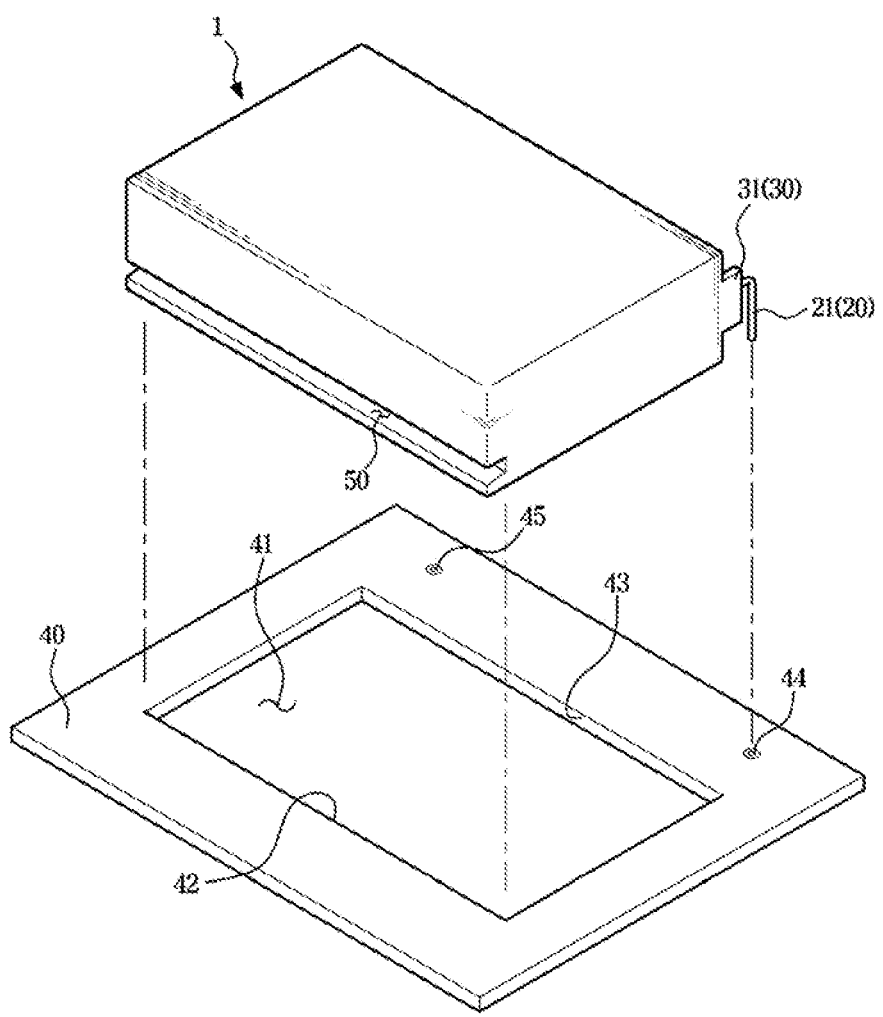
FIG. 3 is a perspective view of the capacitor and a substrate according to one embodiment of the present disclosure, particularly illustrating a state before the capacitor is mounted on the substrate.
Figure 4:
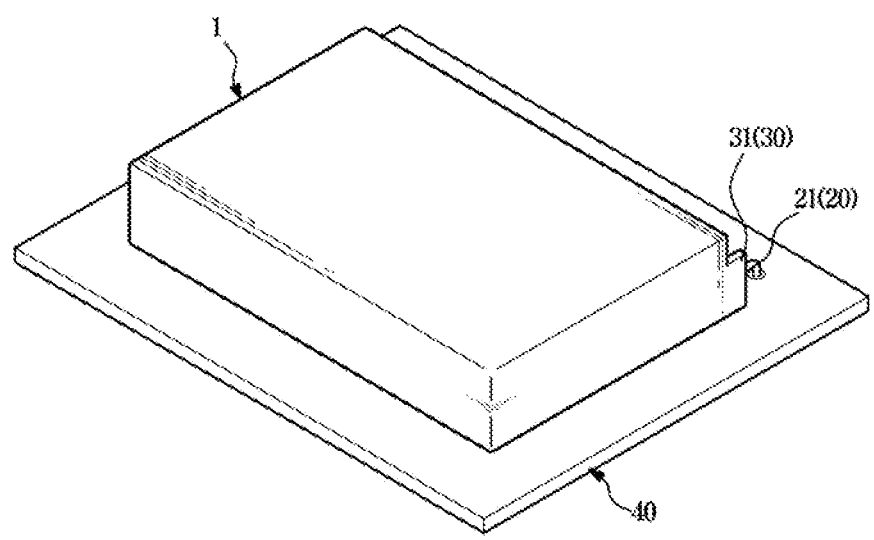
FIG. 4 is a perspective view of the capacitor and the substrate according to one embodiment of the present disclosure, particularly illustrating a state after the capacitor is mounted on the substrate.

FIG. 3 is a perspective view of the capacitor and the substrate according to one embodiment of the present disclosure, particularly illustrating a state before the capacitor is mounted on the substrate. FIG. 4 is a perspective view of the capacitor and the substrate according to one embodiment of the present disclosure, particularly illustrating a state after the capacitor is mounted on the substrate.

Referring to FIGS. 3 and 4, the capacitor 1 according to one embodiment of the present disclosure may be mounted on the substrate 40.

The capacitor 1 may be mounted on the substrate 40 on which the capacitor hole 41 is formed. The capacitor hole 41 may be formed to penetrate the substrate 40. The capacitor hole 41 may be provided in accordance with the size of the case 10.

Although the substrate 40 is shown to be small in the drawings, the actual substrate 40 may be provided larger. The substrate 40 may include the capacitor hole 41 into which the capacitor 1 is inserted, and wire holes 44 and 45 into which the lead wire 20 is inserted. The wire holes 44 and 45 may include a first wire hole 44 through which the first lead wire 21 is inserted and a second wire hole 45 through which the second lead wire 22 is inserted. Based on the capacitor 1 being mounted on the substrate 40, the substrate 40 may include a first substrate surface 43 in contact with the first side surface 13 of the case 10 and a second substrate surface 42 in contact with the second side surface 14 of the case 10. Hereinafter the first substrate surface 43 may be referred to as one surface, which forms the capacitor hole 41, of the substrate 40. In addition, the second substrate surface 42 may be referred to as the other surface, which forms the capacitor hole 41, of the substrate 40.

As shown in FIG. 4, the capacitor 1 may be inserted into the capacitor hole 41 of the substrate 40. The capacitor 1 in a state of being inserted into the capacitor hole 41 may be mounted on the substrate 40. The capacitor 1 may be fixed to the substrate 40 by being inserted into the capacitor hole 41.

Figure 5:
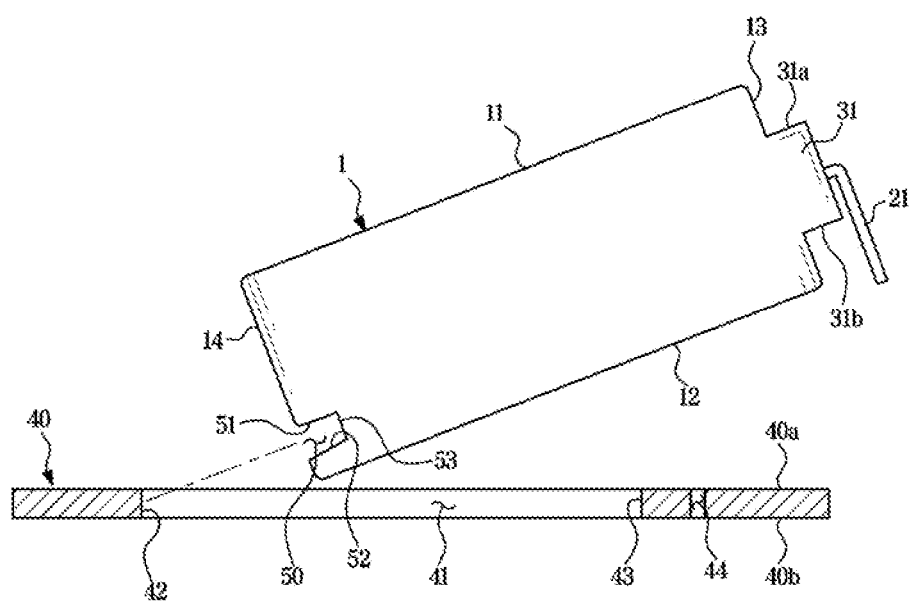
FIG. 5 is a side view of the capacitor and the substrate according to one embodiment of the present disclosure, particularly illustrating a state before the capacitor is mounted on the substrate.
Figure 6:
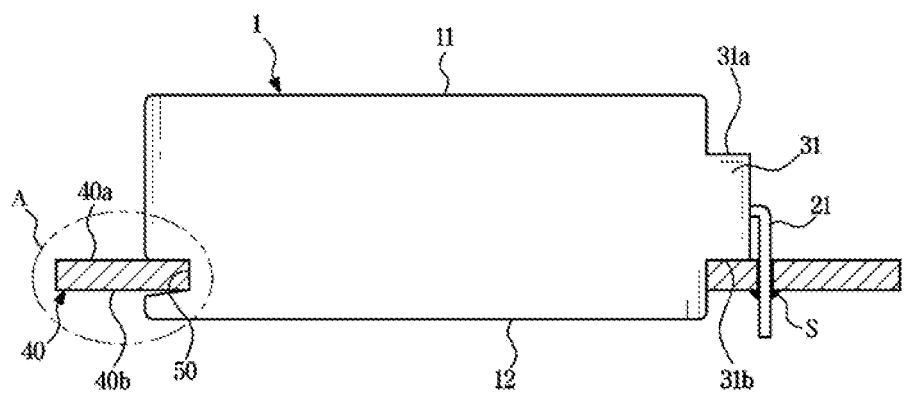
FIG. 6 is a side view of the capacitor and the substrate according to one embodiment of the present disclosure, particularly illustrating a state after the capacitor is mounted on the substrate.

FIG. 5 is a side view of the capacitor and the substrate according to one embodiment of the present disclosure, particularly illustrating a state before the capacitor is mounted on the substrate. FIG. 6 is a side view of the capacitor and the substrate according to one embodiment of the present disclosure, particularly illustrating a state after the capacitor is mounted on the substrate.

Hereinafter a process of mounting the capacitor 1 to the substrate 40 according to one embodiment of the present disclosure will be described in detail with reference to FIGS. 5 and 6.

As shown in FIGS. 5 and 6, the capacitor 1 may be inserted into the capacitor hole 41 of the substrate 40 by moving the capacitor 1 obliquely with respect to the substrate 40. Particularly, the groove 50 of the capacitor 1 may face the second substrate surface 42 of the substrate 40, and the capacitor 1 may be moved obliquely with respect to the substrate 40 to allow the second substrate surface 42 to be inserted into the groove 50. When the groove 50 is engaged with the second substrate surface 42, the case 10 may be moved to allow the lead wire 20 to be inserted into the wire holes 44 and 45. At this time, the case 10 may be rotated using the groove 50 as a rotation axis. By the above-mentioned process, the capacitor 1 may be inserted into the capacitor hole 41 of the substrate 40 and mounted on the substrate 40. In addition, the first lead wire 21 may be inserted into the first wire hole 44, and the second lead wire 22 may be inserted into the second wire hole 45. An end of the first lead wire 21 may protrude under a lower surface 40b of the substrate 40 by passing through the first wire hole 44. An end of the second lead wire 22 may protrude under the lower surface 40b of the substrate 40 by passing through the second wire hole 45.

According to one embodiment of the present disclosure, based on the case 10 being mounted on the substrate 40, the groove 50 may include a first surface 51 provided in parallel with the substrate 40, a second surface 52 provided to be inclined at a predetermined angle with respect to the substrate 40, and a third surface 53 connecting the first surface 51 and the second surface 52. The second surface 52 may be provided to be inclined with respect to the first surface 51 to guide the insertion of the substrate 40 into the groove 50.

Due to the second surface 52 of the groove 50, the second substrate surface 42 of the substrate 40 may be smoothly inserted into the groove 50. Because the second surface 52 is inclined with respect to the first surface 51, one end of the groove 50 may have a greater width than the other end of the groove 50. At this time, one end of the groove 50 may correspond to an opened-side of the groove 50, and the other end of the groove 50 may correspond to the third surface 53. In addition, a width may correspond to the size of the groove 50 in the vertical direction.

With the above-mentioned structure, the second substrate surface 42 may be inserted into the groove 50 through the opened-one side of the groove 50 having a relatively large width. Because the width of the opened-one side of the groove 50 is greater than the thickness of the substrate 40, the second substrate surface 42 may be smoothly inserted into the groove 50. Further, due to the second surface 52 of the groove 50, the groove 50 may be provided in a shape that gradually decreases in width from one side thereof to the other side thereof. The width of the groove 50 at the third surface 53 corresponding to the other side of the groove 50 may be substantially the same as the width of the substrate 40. When the capacitor 1 is mounted on the substrate 40, the second substrate surface 42 may be in contact with the third surface 53. Alternatively, when the capacitor 1 is mounted on the substrate 40, a gap in the horizontal direction between the second substrate surface 42 and the third surface 53 may be very small. As described above, because the width of the second substrate surface 42 and the width of the third surface 53 are substantially the same, the groove 50 may be stably engaged with the substrate 40 without a gap. As the second substrate surface 42 is inserted into the groove 50 and engaged with each other, the second surface 14 of the case 10 may be fixed to the substrate 40.

According to one embodiment of the present disclosure, the protrusion 30 may include the first protrusion 31 and the second protrusion as mentioned above. The first protrusion 31 may include an upper surface 31a and a lower surface 31b. Although not shown in the drawing, the second protrusion 32 may include an upper surface and a lower surface as the same manner as the first protrusion 31. Hereinafter the first protrusion 31 will be described as an example.

As shown in FIG. 6, the first protrusion 31 may be provided to allow the lower surface 31b of the first protrusion 31 to be in contact with the upper surface 40a of the substrate 40. When the capacitor 1 is inserted into the capacitor hole 41 of the substrate 40, the lower surface 31b of the first protrusion 31 may come into contact with the upper surface 40a of the substrate 40 so as to prevent the capacitor 1 from passing through the capacitor hole 41. Because the lower surface 31b of the first protrusion 31 is in contact with the upper surface 40a of the substrate 40, the capacitor 1 may be horizontally mounted on the substrate 40. For this, the first surface 51 of the groove 50 and the lower surface 31b of the first protrusion 31 may be provided to be substantially on the same plane. Although not shown in the drawings, the lower surface of the second protrusion 32 may also be provided to be in contact with the upper surface 40a of the substrate 40 in the same manner as the first protrusion 31.

When the lower surface 31b of the first protrusion 31 is in contact with the upper surface 40a of the substrate 40, the first side surface 13 and the first substrate surface 43 may be in contact with each other. As the first side surface 13 of the case 10 is in contact with the first substrate surface 43 and the second side surface 14 of the case 10 is in contact with the second substrate surface 42, the case 10 may be inserted and fixed to the capacitor hole 41.

In addition, as shown in FIG. 6, the end of the first lead wire 21 may protrude to the lower surface 40b of the substrate 40 by passing through the first wire hole 44. A soldering process may be performed on the lower surface 40b of the substrate 40 to electrically connect the first lead wire 21 and the substrate 40. A solder S may electrically connect the substrate 40 and the first lead wire 21. Because the substrate 40 and the first lead wire 21 are electrically connected, the substrate 40 and the dielectric inside the case 10 may be electrically connected. Although not shown in the drawings, the second lead wire 22 may also be electrically connected to the substrate 40 by solder.

Capacitors are used in various electronic products and are also used in television (TV). In recent years, research on ultra-slim TV has been continuously conducted, and there is a growing need of the reduction in thickness of the substrate to which the capacitor is mounted. However, the capacitance of the capacitor may be reduced when the thickness of the capacitor is reduced while maintain a cross-sectional area.

According to the present disclosure, it is possible to reduce the sum of the thickness of the substrate and the thickness of the capacitor mounted on the substrate while maintaining the thickness of the capacitor or minimizing the reduction in thickness of the capacitor.

In the conventional manner, the capacitor is mounted on one surface of the substrate. The capacitor is mounted on one surface of the substrate and an adhesive such as silicone is used to fix the capacitor to the substrate. Because the capacitor in the conventional manner is mounted on the substrate, the thickness of the capacitor mounted on the substrate corresponds to the sum of the thickness of the substrate, the thickness of the capacitor and the thickness of the adhesive.

According to the present disclosure, the capacitor may be inserted and fixed to the hole formed at the substrate. The upper surface of the capacitor may be provided to be positioned above the upper surface of the substrate, and the lower surface of the capacitor may be provided to be positioned below the lower surface of the substrate. In addition, in fixing the capacitor to the substrate, a separate subsidiary material such as silicon may not be required. According to the present disclosure, the sum of the thickness of the substrate and the thickness of the capacitor mounted to the substrate may be less than the sum of the thicknesses of the capacitor and the thicknesses of the substrate. Although the capacitor according to the present disclosure substantially has the same thickness and the same capacitance as the capacitor in the conventional manner, the sum of the thickness of the substrate and the thickness of the capacitor mounted on the substrate may be reduced in comparison with the conventional manner. Accordingly, it may be possible to reduce the thickness of the electronic products in which the capacitor is used. In addition, because a separate subsidiary material is not required to fix the capacitor to the substrate, it may be possible to reduce the production cost.

Figure 7:
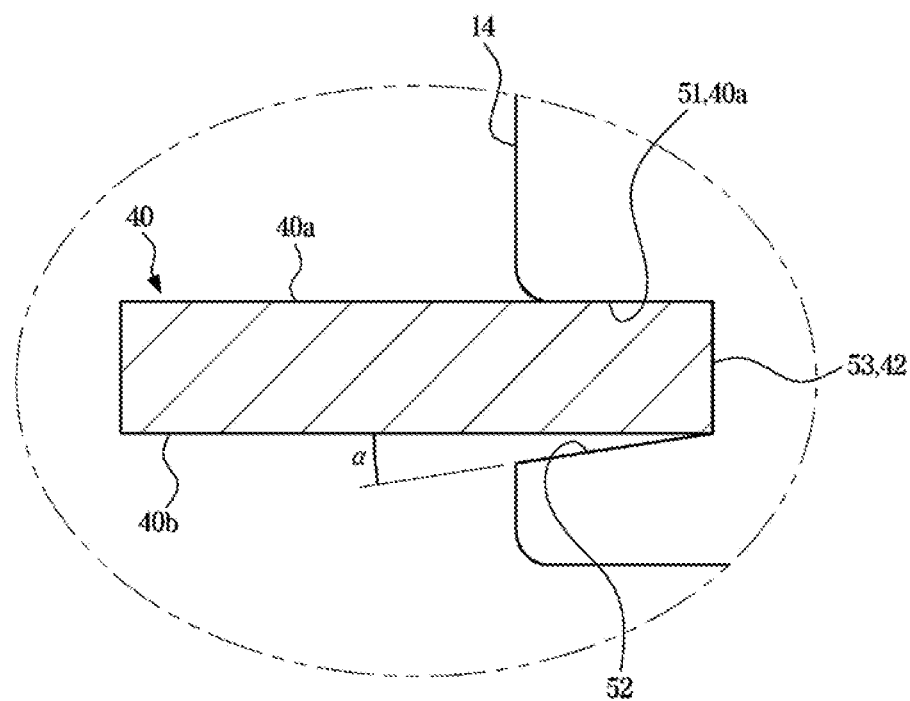
FIG. 7 is an enlarged view of part A shown in FIG. 6.

FIG. 7 is an enlarged view of part A shown in FIG. 6.

An inclination angle of the second surface 52 of the groove 50 according to one embodiment of the present disclosure will be described with reference to FIG. 7.

As described above, the groove 50 may include the first surface 51 provided horizontally and the second surface 52 provided to be inclined with respect to the first surface. Because the second surface 52 is provided to be inclined with respect to the first surface 51, coupling between the groove 50 and the substrate 40 may be facilitated. However, when an inclination angle α between the second surface 52 and the first surface 51 is relatively large, the substrate 40 inserted into the groove 50 may not be stably fixed. In a state in which the inclination angle α between the second surface 52 and the first surface 51 is relatively small, the substrate 40 may be damaged when the substrate 40 is inserted into the groove 50.

According to one embodiment of the present disclosure, in order to stably fix the substrate 40 inserted into the groove 50 and in order to easily couple the groove 50 and the substrate 40, it is appropriate that the inclination angle α between the first surface 51 and the second surface 52 is provided in a range of 4° to 10°. That is, it is appropriate that the inclination angle α is $4° \leq \alpha \leq 10°$.

Figure 8:
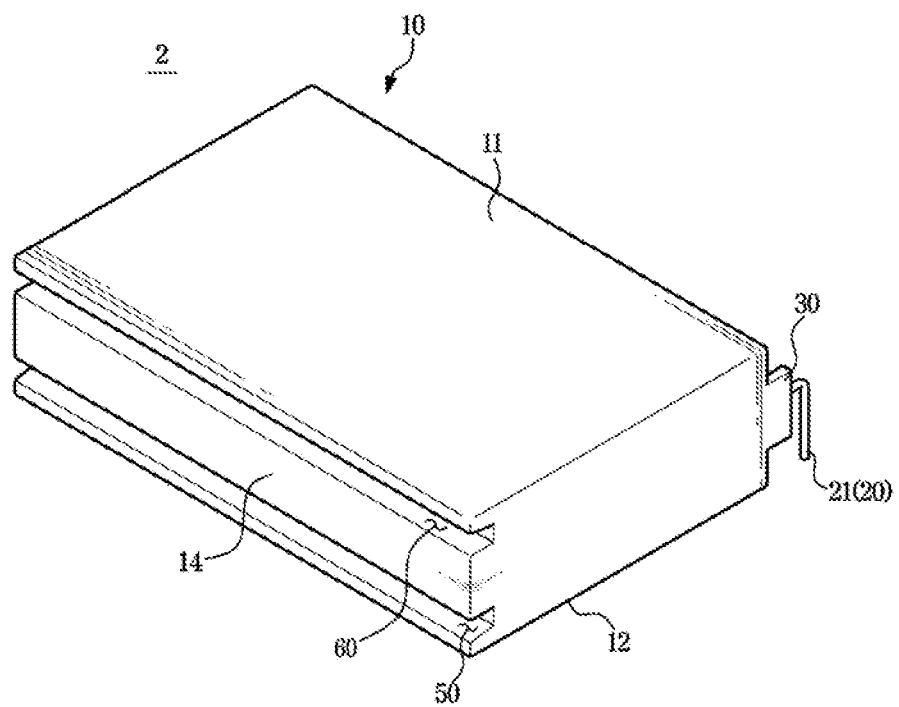
FIG. 8 is a perspective view of a capacitor according to another embodiment of the present disclosure.
Figure 9:
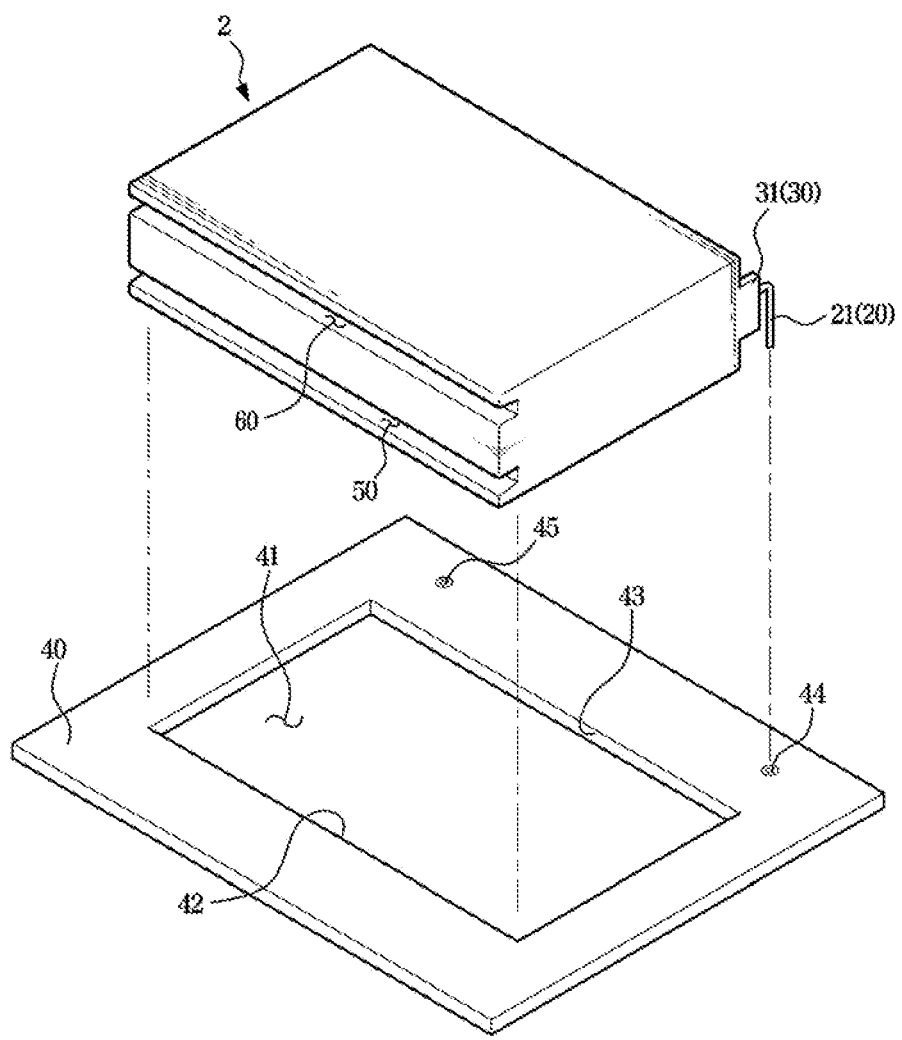
FIG. 9 is a perspective view of the capacitor and the substrate according to another embodiment of the present disclosure, particularly illustrating a state before the capacitor is mounted on the substrate.

FIG. 8 is a perspective view of a capacitor according to another embodiment of the present disclosure. FIG. 9 is a perspective view of the capacitor and the substrate according to another embodiment of the present disclosure, particularly illustrating a state before the capacitor is mounted on the substrate.

As shown in FIGS. 8 and 9, according to another embodiment of the present disclosure, a capacitor 2 may include a pair of grooves 50 and 60. Configurations other than the pair of grooves 50 and 60 are the same as those of the embodiment shown in FIGS. 1 to 7, and thus descriptions thereof will be omitted.

According to another embodiment of the present disclosure, the capacitor 2 may include a first groove 50 and a second groove 60. The first groove 50 and the second groove 60 may be provided on the second side surface 14 of the case 10. The first groove 50 and the second groove 60 may be provided to be vertically spaced apart.

Figure 10:
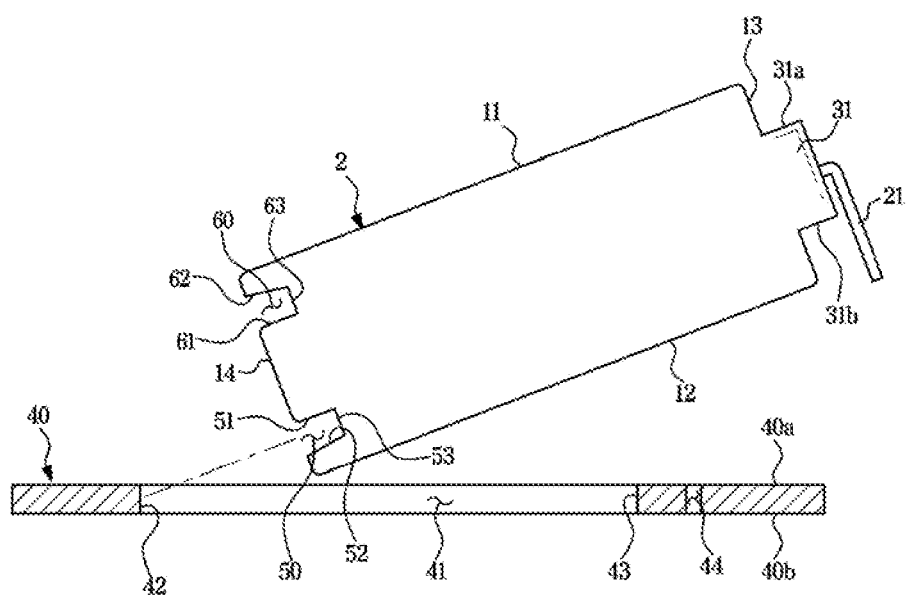
FIG. 10 is a side view of the capacitor and the substrate according to another embodiment of the present disclosure, particularly illustrating a state before the capacitor is mounted on the substrate.
Figure 11:
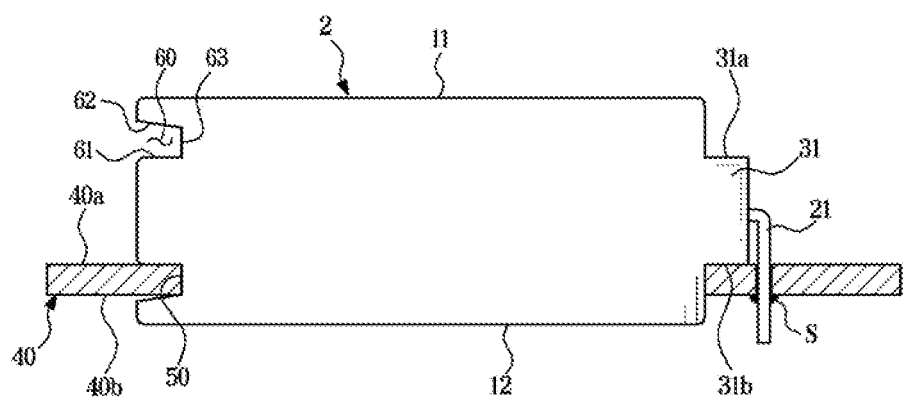
FIG. 11 is a side view of the capacitor and the substrate according to another embodiment of the present disclosure, particularly illustrating a state after the capacitor is mounted on the substrate.

FIG. 10 is a side view of the capacitor and the substrate according to another embodiment of the present disclosure, particularly illustrating a state before the capacitor is fixed to the substrate. FIG. 11 is a side view of the capacitor and the substrate according to another embodiment of the present disclosure, particularly illustrating a state after the capacitor is fixed to the substrate.

Referring to FIGS. 10 and 11, the capacitor 2 may include the first groove 50 and the second groove 60. One of the first groove 50 and the second groove 60 may be engaged with the substrate 40. Particularly, the substrate 40 may be engaged with the first groove 50 or the second groove 60 according to a direction in which the lead wire 20 is bent. In other words, the second substrate surface 42 of the substrate 40 may be inserted into the first groove 50 or the second groove 60.

According to another embodiment of the present disclosure, because the capacitor 2 includes the first groove 50 and the second groove 60, a degree of freedom in a bending direction of the lead wire 20 may be increased. According to another embodiment of the present disclosure, the case 10 of the capacitor 2 may be provided vertically symmetrically with respect to a virtual center line extending in the horizontal direction. Accordingly, a second surface 62 of the second groove 60 may be provided to be positioned above a first surface 61 in the drawing, which is different from the first groove 50. In addition, a distance from the upper surface 11 of the case 10 to the upper surface 31a of the first protrusion 31 may be the same as a distance from the lower surface 12 of the case 10 to the lower surface 31b of the first protrusion 31.

The first groove 50 and the second groove 60 include the same structure, and thus when the lead wire 20 is bent upwardly in the drawings, the capacitor 2 may be mounted on the substrate 40 in such a way that the second groove 60 is arranged to face the lower side. Alternatively, as shown in FIGS. 10 and 11, when the lead wire 20 is bent downward in the drawing, the capacitor 2 may be mounted on the substrate 40 in such a way that the first groove 50 is arranged to face the lower side.

When the bending direction of the lead wire 20 is predetermined and the lead wire 20 is bent in only one direction, the productivity may be reduced. On the other hand, when the bending direction of the lead wire 20 is not determined, the productivity may be increased. According to another embodiment of the present disclosure, the bending direction of the lead wire 20 is not predetermined and thus the productivity of the capacitor 2 may be increased.

Figure 12:
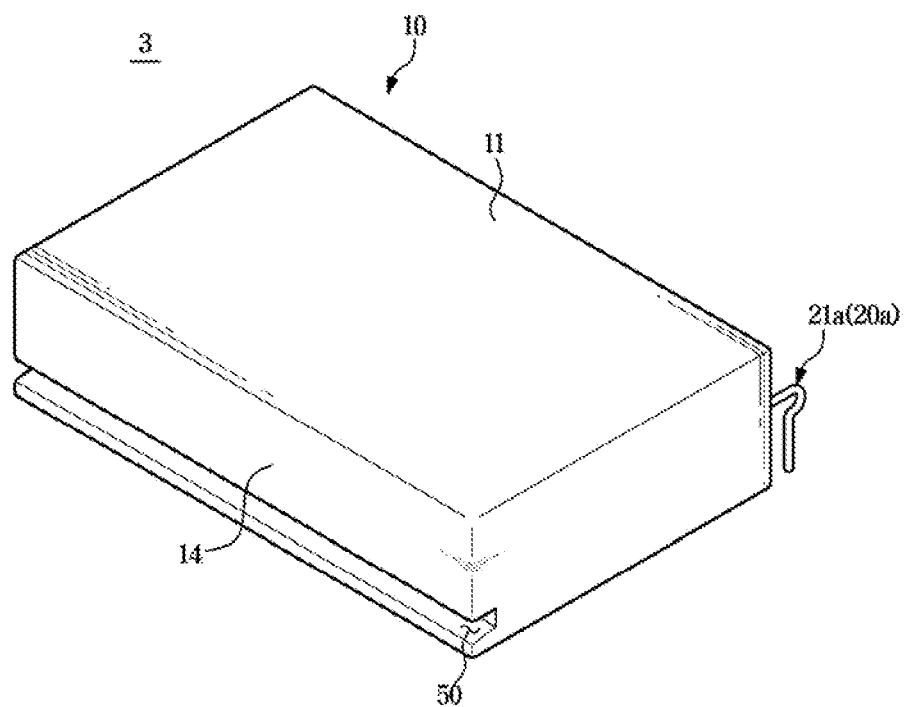
FIG. 12 is a perspective view of a capacitor according to still another embodiment of the present disclosure.
Figure 13:
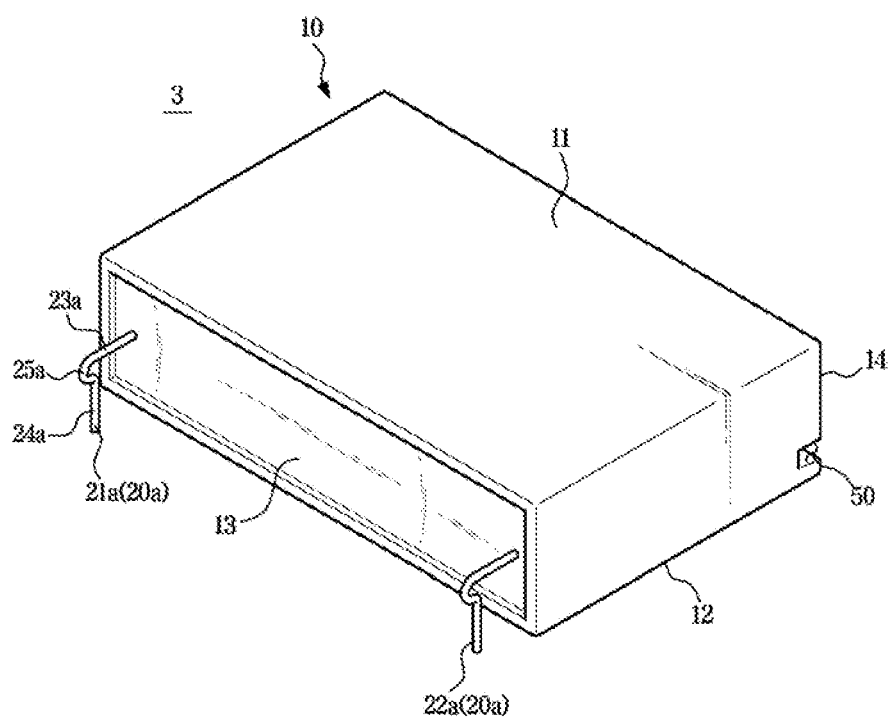
FIG. 13 is a view illustrating the capacitor shown in FIG. 12 from another angle.

FIG. 12 is a perspective view of a capacitor according to still another embodiment of the present disclosure. FIG. 13 is a view illustrating the capacitor shown in FIG. 12 from another angle.

Referring to FIGS. 12 and 13, according to still another embodiment of the present disclosure, a capacitor 3 may include a lead wire 20a including a protruding member 25a formed by a lead forming process. The capacitor 3 may not include a protrusion provided on the first surface 13 of the case 10. Configurations other than the lead wire 20a and the protrusion of the case are the same as those of the embodiment shown in FIGS. 1 to 7, and thus descriptions thereof will be omitted.

Figure 14:
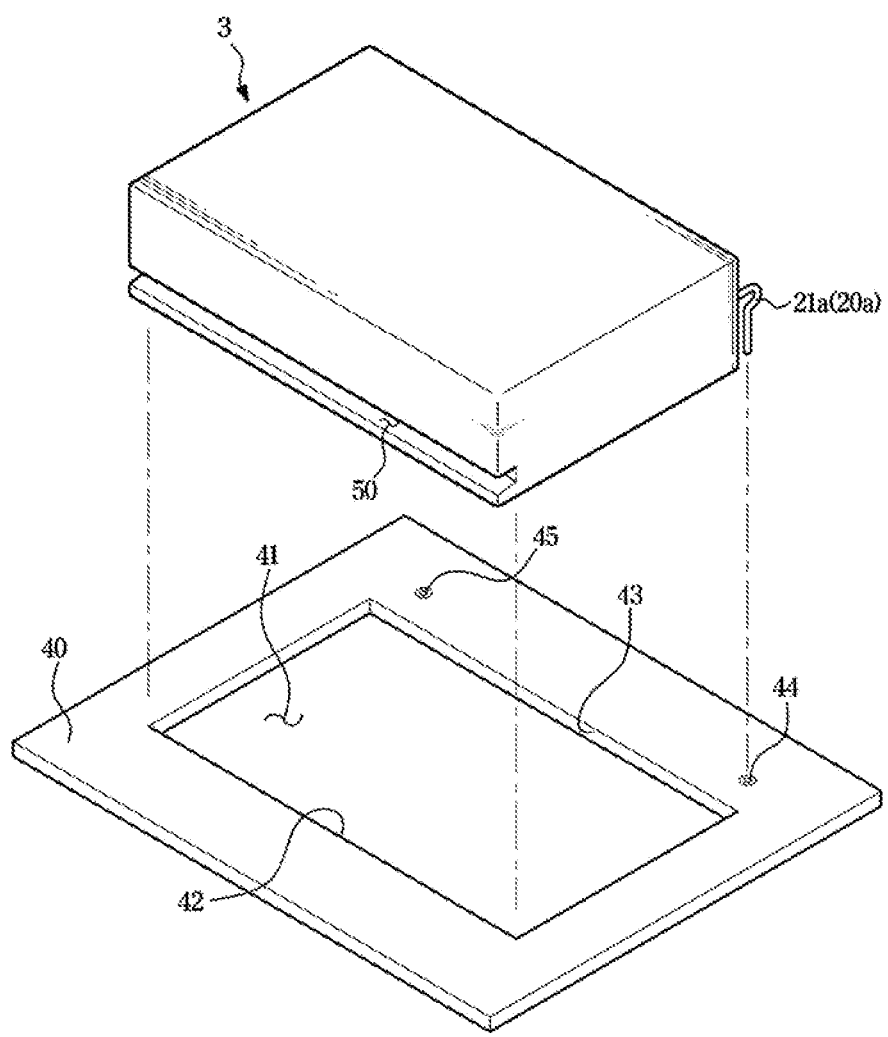
FIG. 14 is a perspective view of the capacitor and the substrate according to still another embodiment of the present disclosure, particularly illustrating a state before the capacitor is mounted on the substrate.
Figure 15:
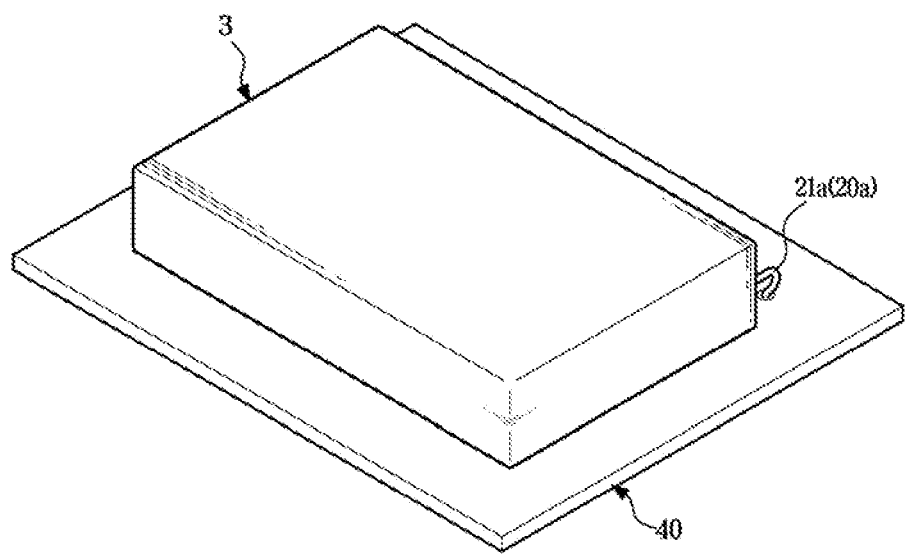
FIG. 15 is a perspective view of the capacitor and the substrate according to still another embodiment of the present disclosure, particularly illustrating a state after the capacitor is mounted on the substrate.
Figure 16:
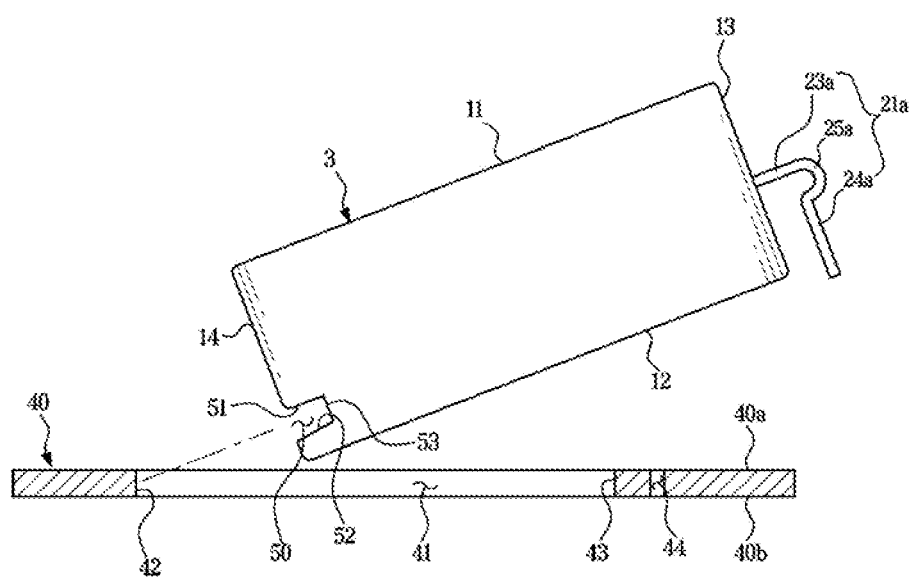
FIG. 16 is a side view of the capacitor and the substrate according to still another embodiment of the present disclosure, particularly illustrating a state before the capacitor is mounted on the substrate.
Figure 17:
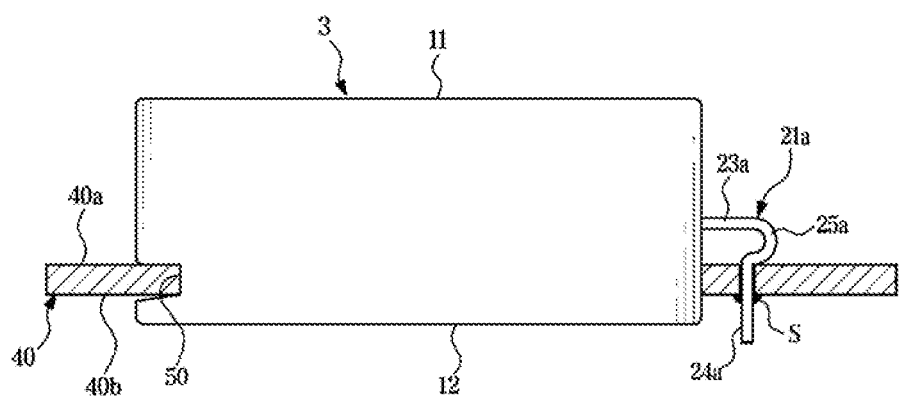
FIG. 17 is a side view of the capacitor and the substrate according to still another embodiment of the present disclosure, particularly illustrating a state after the capacitor is mounted on the substrate.

FIG. 14 is a perspective view of the capacitor and the substrate according to still another embodiment of the present disclosure, particularly illustrating a state before the capacitor is mounted on the substrate. FIG. 15 is a perspective view of the capacitor and the substrate according to still another embodiment of the present disclosure, particularly illustrating a state after the capacitor is mounted on the substrate. FIG. 16 is a side view of the capacitor and the substrate according to still another embodiment of the present disclosure, particularly illustrating a state before the capacitor is mounted on the substrate. FIG. 17 is a side view of the capacitor and the substrate according to still another embodiment of the present disclosure, particularly illustrating a state after the capacitor is mounted on the substrate.

Referring to FIGS. 14 to 17, the capacitor 3 according to still another embodiment of the present disclosure may include the lead wire 20a. The lead wire 20a may include a first lead wire 21a and a second lead wire 22a. Because the first lead wire 21a and the second lead wire 22a have the same structure, the first lead wire 21a will be described as an example.

The first lead wire 21a may include a first wire 23a extending to the outside of the case 10 by passing through the first side surface 13 of the case 10, and a second wire 24a provided to pass through a first wire hole 44 of the substrate 40, and a protruding member 25a connecting the first wire 23a and the second wire 24a.

The first wire 23a may extend substantially horizontally to the substrate 40, and the second wire 24a may extend substantially perpendicular to the substrate 40.

The protruding member 25a may be provided to connect one end of the first wire 23a and one end of the second wire 24a. The protruding member 25a may be formed in a substantially semicircular shape by a lead forming process. The protruding member 25a may be provided to include a portion protruding outward than the second wire 24a in a lateral side on the drawings with respect to the first surface 13 of the case 10. The protruding member 25a may be bent to protrude outward of the first wire hole 44. The protruding member 25a may allow only from one end of the second wire 24a to the other end of the second wire 24a to be inserted or passed through the first wire hole 44. The protruding member 25a may not be inserted into the first wire hole 44 by including the portion protruding further than the second wire 24a in the horizontal direction. The first wire hole 44 may extend in the vertical direction, and a width in the left and right direction of the first wire hole 44 may be slightly greater than the thickness of the second wire 24a.

The protruding member 25a may be connected to the upper end of the second wire 24a and bent outward from the upper end thereof. With the structure, the second wire 24a extending in the vertical direction may pass or be inserted into the first wire hole 44, and the protruding member 25a may be located above the upper surface 40a of the substrate 40.

The protruding member 25a may perform a function similar to that of the protrusion 30 illustrated in FIGS. 1 to 7. The protruding member 25a may be provided to allow one end of the protruding member 25a connected to the second wire 24a to be in contact with the upper surface 40a of the substrate 40. The capacitor 3 may be horizontally mounted on the substrate 40 as the protruding member 25a is in contact with the upper surface 40a of the substrate 40. As the protruding member 25a comes into contact with the upper surface 40a of the substrate 40, the capacitor 3 may not pass through the capacitor hole 41.

Figure 18:
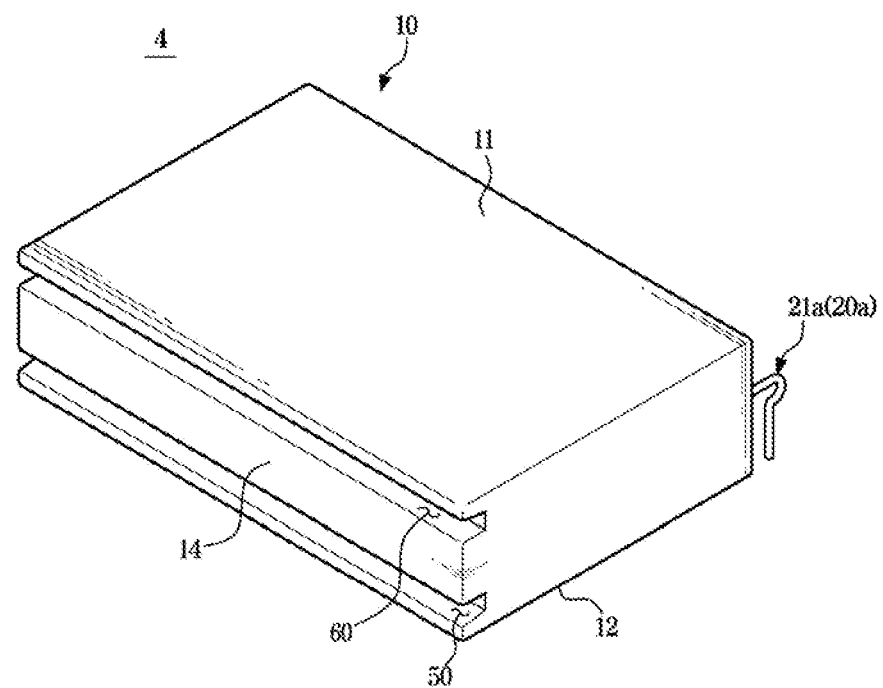
FIG. 18 is a perspective view of a capacitor according to still another embodiment of the present disclosure.
Figure 19:
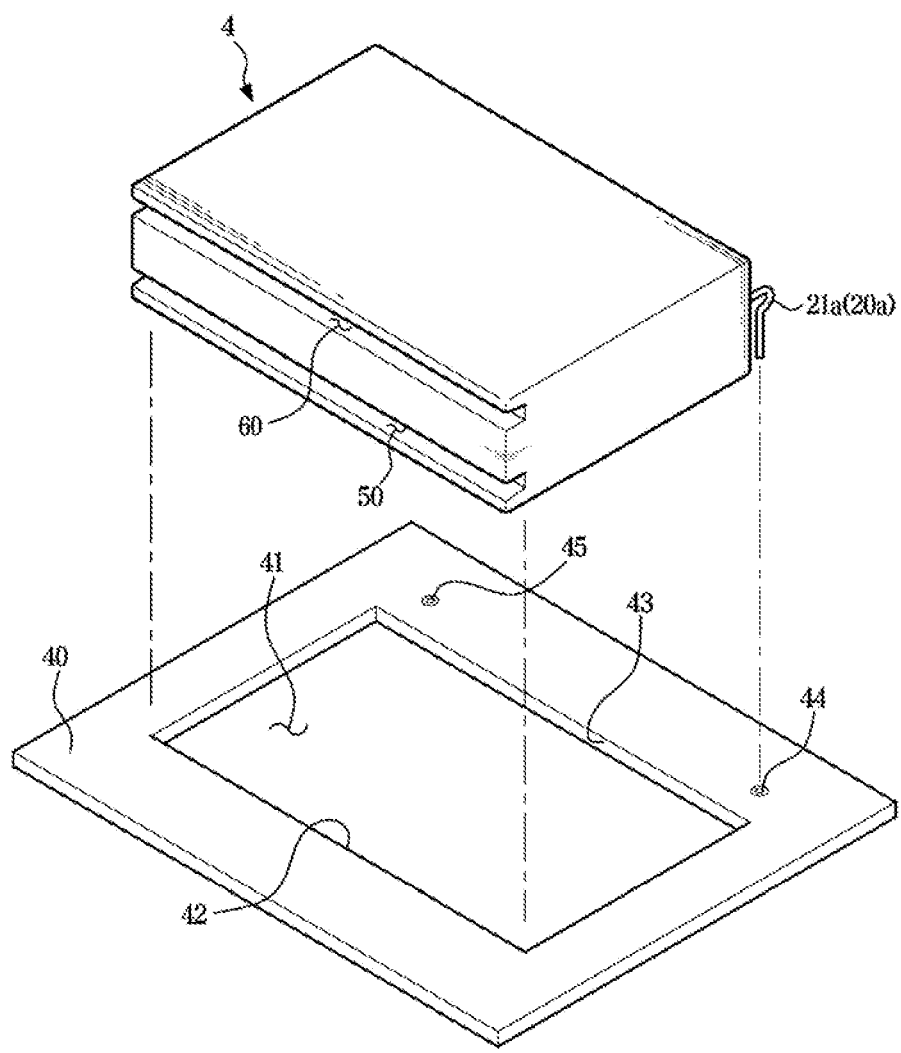
FIG. 19 is a perspective view of the capacitor and the substrate according to still another embodiment of the present disclosure, particularly illustrating a state before the capacitor is mounted on the substrate.

FIG. 18 is a perspective view of a capacitor according to still another embodiment of the present disclosure. FIG. 19 is a perspective view of the capacitor and the substrate according to still another embodiment of the present disclosure, particularly illustrating a state before the capacitor is mounted on the substrate.

Referring to FIGS. 18 and 19, according to still another embodiment of the present disclosure, a capacitor 4 may include a pair of grooves 50 and 60. Configurations other than the grooves 50 and 60 are the same as those of the embodiment shown in FIGS. 12 to 17, and thus descriptions thereof will be omitted.

According to still another embodiment of the present disclosure, the capacitor 4 may include a first groove 50 and a second groove 60. The first groove 50 and the second groove 60 may be provided on the second side surface 14 of the case 10. The first groove 50 and the second groove 60 may be provided to be vertically spaced apart.

Figure 20:
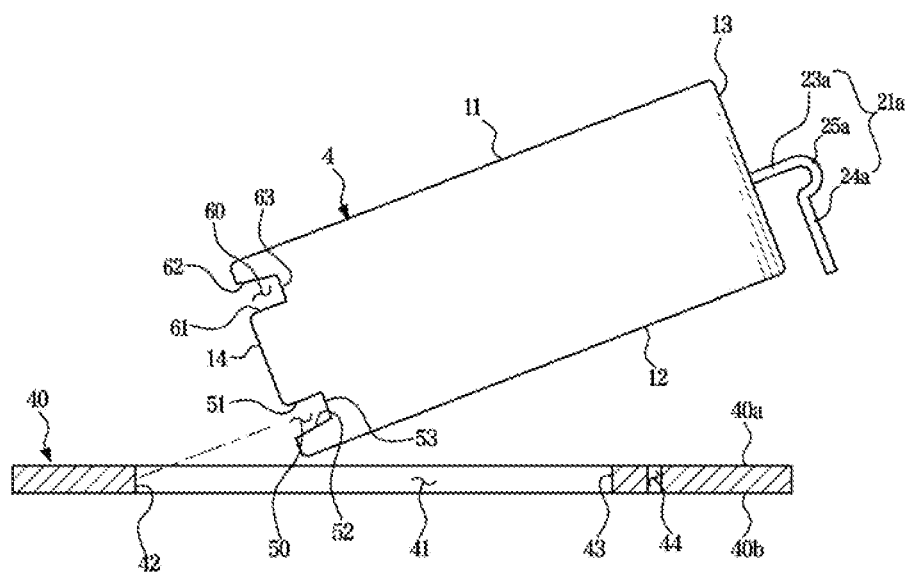
FIG. 20 is a side view of the capacitor and the substrate according to still another embodiment of the present disclosure, particularly illustrating a state before the capacitor is mounted on the substrate.
Figure 21:
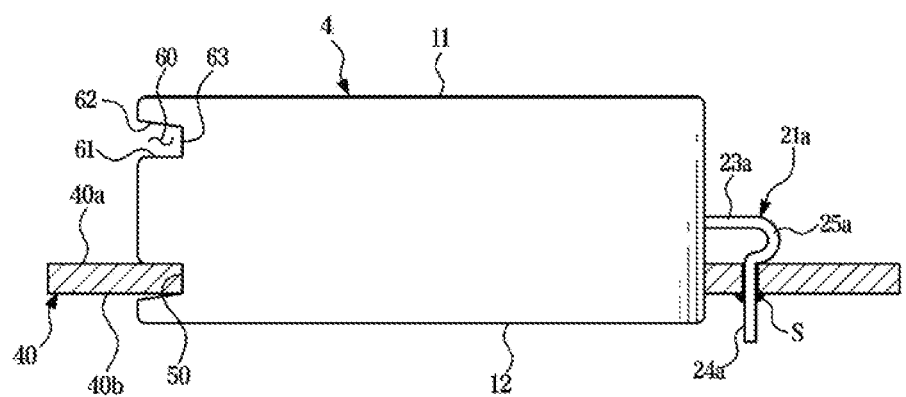
FIG. 21 is a side view of the capacitor and the substrate according to still another embodiment of the present disclosure, particularly illustrating a state after the capacitor is mounted on the substrate.

FIG. 20 is a side view of the capacitor and the substrate according to still another embodiment of the present disclosure, particularly illustrating a state before the capacitor is fixed to the substrate. FIG. 21 is a side view of the capacitor and the substrate according to still another embodiment of the present disclosure, particularly illustrating a state after the capacitor is fixed to the substrate.

Referring to FIGS. 20 and 21, the capacitor 4 according to still another embodiment of the present disclosure may include the first groove 50 and the second groove 60, and one of the first groove 50 and the second groove 60 may be engaged with the substrate 40. Particularly, the first groove 50 or the second groove 60 may be coupled to the substrate 40 according to the direction in which the lead wire 20a is bent. In other words, the second surface 42 of the substrate 40 may be inserted into the first groove 50 or the second groove 60.

According to still another embodiment of the present disclosure, because the capacitor 4 includes the first groove 50 and the second groove 60, a degree of freedom in a bending direction of the lead wire 20a may be increased. According to still another embodiment of the present disclosure, the case 10 of the capacitor 4 may be provided vertically symmetrically with respect to a virtual center line extending in the horizontal direction. Accordingly, the second surface 62 of the second groove 60 may be provided to be positioned above the first surface 61 in the drawing, which is different from the first groove 50.

The first groove 50 and the second groove 60 include the same structure, and thus when the lead wire 20a is bent upwardly on the drawing, the capacitor 4 may be mounted on the substrate 40 in such a way that the second groove 60 is arranged to face the lower side. Alternatively, as shown in FIGS. 20 and 21, when the lead wire 20a is bent downward in the drawing, the capacitor 4 may be mounted on the substrate 40 in such a way that the first groove 50 is arranged to face the lower side.

When the bending direction of the lead wire 20a is predetermined and the lead wire 20a is bent in only one direction, the productivity may be reduced. On the other hand, when the bending direction of the lead wire 20a is not determined, the productivity may be increased. According to still another embodiment of the present disclosure, the bending direction of the lead wire 20a is not predetermined and thus the productivity of the capacitor 4 may be increased.

Figure 22:
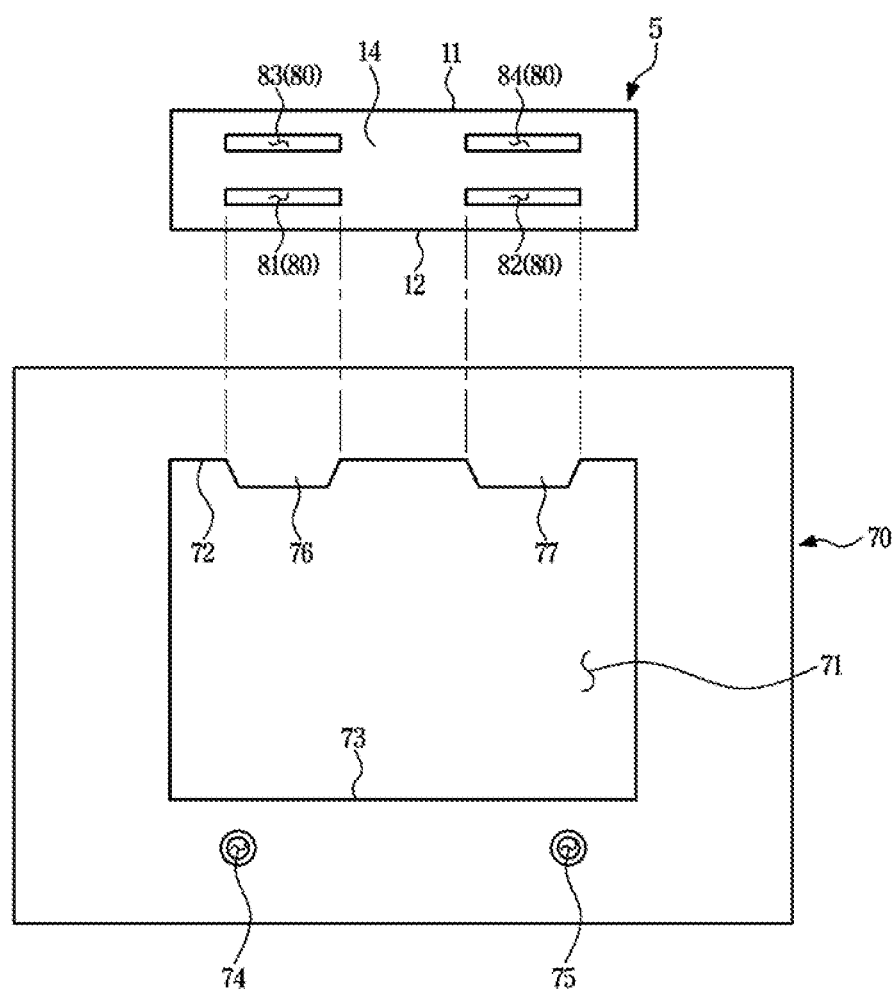
FIG. 22 is a view illustrating a capacitor and a substrate according to still another embodiment of the present disclosure.

FIG. 22 is a view illustrating a capacitor and a substrate according to still another embodiment of the present disclosure. FIG. 22 illustrates a top plan view of a substrate 70 according to still another embodiment of the present disclosure and a side view of a capacitor 5 according to still another embodiment of the present disclosure.

According to still another embodiment of the present disclosure, the substrate 70 may include a capacitor hole 71 through which the capacitor 5 is inserted. In addition, the substrate 70 may include a first substrate surface 72 forming a circumference of the capacitor hole 71 and a second substrate surface 73 provided to face the first substrate surface 72. In addition, the substrate 70 may include a first wire hole 74 and a second wire hole 75 into which a first lead wire (not shown) and a second lead wire (not shown) are inserted.

According to still another embodiment of the present disclosure, the substrate 70 may include substrate protrusions 76 and 77. The substrate protrusions 76 and 77 may include a first substrate protrusion 76 and a second substrate protrusion 77 provided to be spaced apart from each other. However, the present disclosure is not limited thereto, and one or three or more substrate protrusions may be provided.

According to still another embodiment of the present disclosure, the capacitor 5 may include a groove 80. The groove 80 may include a first groove 81 and a second groove 82 into which the first substrate protrusion 76 and the second substrate protrusion 77 are inserted, respectively. In addition, the groove 80 may include a third groove 83 and a fourth groove 84 provided to be vertically spaced apart from the first groove 81 and the second groove 82 that is regardless of the bending direction of the lead wire (not shown). However, it is not limited thereto, and thus the groove 80 may include only the first groove and the second groove.

According to still another embodiment of the present disclosure, the substrate 70 may include the first substrate protrusion 76 and the second substrate protrusion 77 having the same size. The capacitor 5 may include the first and second grooves 81 and 82 respectively corresponding to the first and second substrate protrusions 76 and 77. Because the first substrate protrusion 76 is inserted into the first groove 81 and the second substrate protrusion 77 is inserted into the second groove 82, the gap in the left and right direction may be reduced when the capacitor 5 is mounted on the substrate 70. The coupling force of the capacitor 5 to the substrate 70 may be improved. Even if vibration occurs in the substrate 70, the capacitor 5 may be stably coupled to the substrate 70.

Meanwhile, although not shown in the drawings, the substrate may include a single substrate protrusion, and the capacitor may include a groove corresponding to the substrate protrusion. At this time, the size of the substrate protrusion may be different from the size of the groove in order to distinguish the capacitor from the capacitor having the same size but having different capacitance. For example, a small groove may be provided in a capacitor having a small capacitance, and a small substrate protrusion may be provided in the substrate. A large groove may be provided in a capacitor having a large capacitance, and a large substrate protrusion may be provided in the substrate. Accordingly, capacitors having different capacitance but having the same size may be easily distinguished.

Figure 23:
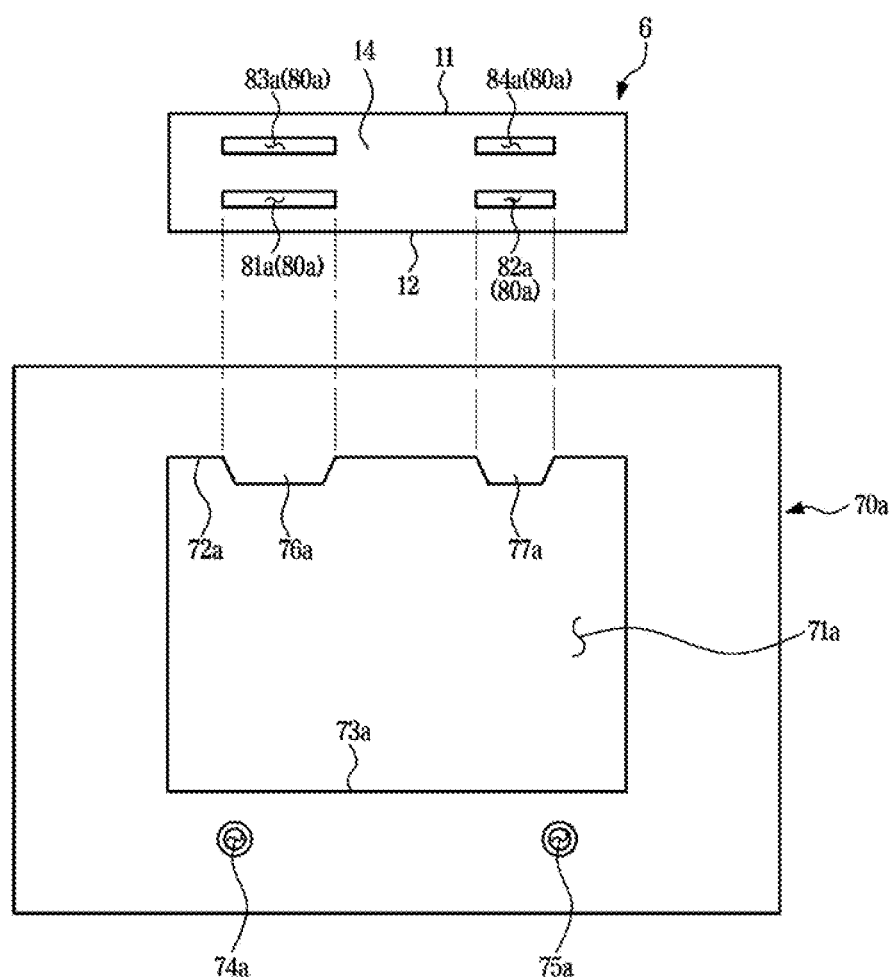
FIG. 23 is a view illustrating a capacitor and a substrate according to still another embodiment of the present disclosure.

FIG. 23 is a view illustrating a capacitor and a substrate according to still another embodiment of the present disclosure.

According to still another embodiment of the present disclosure, a substrate 70a may include a capacitor hole 71a through which a capacitor 6 is inserted. In addition, the substrate 70a may include a first substrate surface 72a forming a circumference of the capacitor hole 71a and a second substrate surface 73a provided to face the first substrate surface 72a. In addition, the substrate 70a may include a first wire hole 74a and a second wire hole 75a into which a first lead wire (not shown) and a second lead wire (not shown) are inserted.

According to still another embodiment of the present disclosure, the substrate 70a may include substrate protrusions 76a and 77a. The substrate protrusions 76a and 77a may include a first substrate protrusion 76a and a second substrate protrusion 77a provided to be spaced apart from each other and provided to have different sizes.

According to still another embodiment of the present disclosure, the capacitor 6 may include a groove 80a. The groove 80a may include a first groove 81a and a second groove 82a into which the first substrate protrusion 76a and the second substrate protrusion 77a are respectively inserted. In addition, the groove 80a may include a third groove 83a and a fourth groove 84a provided to be vertically spaced apart from the first groove 81a and the second groove 82a that is regardless of the bending direction of the lead wire (not shown). However, it is not limited thereto, and thus the groove 80a may include only the first groove and the second groove.

According to still another embodiment of the present disclosure, the first substrate protrusion 76a and the second substrate protrusion 77a may be provided to have different sizes, and the first groove 81a and the second groove 82a may be provided to have a size in accordance with the size of the first substrate protrusion 76a and the second substrate protrusion 77a, respectively. The first substrate protrusion 76a may be inserted into the first groove 81a, and the second substrate protrusion 77a may be inserted into the second groove 82a. However, the second substrate protrusion 77a may not be inserted into the first groove 81a, and the first substrate protrusion 76a may not be inserted into the second groove 82a. Accordingly, in order to mount the capacitor 6 to the substrate 70a, a user must insert the first substrate protrusion 76a into the first groove 81a and the second substrate protrusion 77a into the second groove 82a according to the size of the substrate protrusion and the groove. This structure is useful when it is required to distinguish between a polarity of the first lead wire and a polarity of the second lead wire. This is because it may be difficult to mount the substrate protrusion to the groove with the opposite polarity because the coupling direction of the groove and the substrate protrusion is determined.

While the present disclosure has been particularly described with reference to exemplary embodiments, it should be understood by those of skilled in the art that various changes in form and details may be made without departing from the spirit and scope of the present disclosure.

What is claimed is:

1. An electronic device, comprising:
a substrate having a hole; and
a capacitor disposed at least partially in the hole and mounted on the substrate,
wherein the capacitor comprises:
a case accommodating a dielectric therein and forming an exterior of the capacitor;
a lead wire connected to the dielectric and extending from an inside of the case to an outside of a first side surface of the case; and
a groove recessed on a second side surface of the case opposite to the first side surface, the groove engaged with a side of the hole of the substrate.

2. The electronic device of claim 1, wherein an upper surface of the capacitor is located above an upper surface of the substrate, and a lower surface of the capacitor is located below a lower surface of the substrate.

3. The electronic device of claim 1, wherein the second side surface of the case is fixed to the substrate by inserting the substrate into the groove.

4. The electronic device of claim 3, wherein the case comprises a protrusion protruding from the first side surface to the outside of the case, and
wherein the first side surface of the case is supported on the substrate through the protrusion contacting the substrate.

5. The electronic device of claim 4, wherein the groove comprises a first contact surface in contact with the upper surface of the substrate, and the protrusion comprises a second contact surface in contact with the upper surface of the substrate, and
wherein the first contact surface and the second contact surface are disposed on the same plane to allow the capacitor to be horizontally mounted on the substrate.

6. The electronic device of claim 4, wherein a distance from an upper surface of the case to an upper surface of the protrusion is the same as a distance from a lower surface of the case to a lower surface of the protrusion.

7. The electronic device of claim 1, wherein the groove comprises:
a first surface in contact with an upper surface of the substrate; and
a second surface inclined with respect to the first surface and configured to guide an insertion of the substrate into the groove.

8. The electronic device of claim 1, wherein the groove comprises a first groove and a second groove provided to be vertically symmetrical with respect to a virtual horizontal line dividing the case.

9. The electronic device of claim 1, wherein the substrate further comprises a wire hole into which the lead wire is inserted,
wherein the lead wire comprises:
a first wire extending from the first side surface of the case;
a second wire inserted into the wire hole; and
a protruding member connecting the first wire and the second wire and bent outward of the wire hole.

10. The electronic device of claim 9, wherein the protruding member is bent in a semicircle.

11. The electronic device of claim 1, wherein the substrate further comprises a substrate protrusion protruding from the side of the hole of the substrate.

12. The electronic device of claim 11, wherein the groove corresponds to the substrate protrusion and is configured to allow the substrate protrusion to be inserted therein.

13. The electronic device of claim 11, wherein the substrate protrusion comprises a first substrate protrusion and a second substrate protrusion spaced apart from each other.

14. The electronic device of claim 13, wherein the first substrate protrusion and the second substrate protrusion are different sizes.

15. The electronic device of claim 13, wherein the groove comprises a first groove and a second groove configured to allow the first substrate protrusion and the second substrate protrusion to be inserted thereto, respectively.

16. An electronic device, comprising:
a substrate having a hole; and
a capacitor mounted on the substrate,
wherein the capacitor comprises:
a case forming an exterior of the capacitor;
a lead wire connected extending from a first side surface of the case; and
a groove on a second side surface of the case opposite to the first side surface, the groove engaged with a side of the hole of the substrate.

17. The electronic device of claim 16, wherein the substrate further comprises a wire hole; and
wherein the lead wire is engaged with the wire hole.

18. The electronic device of claim 17, wherein the groove comprises a first surface contacting an upper surface of the substrate, and a second surface opposite to the first surface and inclined with respect to the first surface.

19. An electronic device, comprising:
a substrate having a hole; and
a capacitor mounted on the substrate,
wherein the capacitor comprises:
a case forming an exterior of the capacitor;
a protrusion protruding from a first side surface of the case and contacting the substrate;
a lead wire extending from the first side surface of the case;
a groove on a second side surface of the case opposite to the first side surface, the groove engaged with a side of the hole of the substrate,
wherein an upper surface of the capacitor is located above an upper surface of the substrate, and a lower surface of the capacitor is located below a lower surface of the substrate.

20. The electronic device of claim 19, wherein the groove comprises a first contact surface in contact with the upper surface of the substrate, and the protrusion comprises a second contact surface in contact with the upper surface of the substrate, and
wherein the first contact surface and the second contact surface are disposed on the same plane.

* * * * *